United States Patent [19]

Arthur et al.

[11] Patent Number: 5,198,295
[45] Date of Patent: * Mar. 30, 1993

[54] CERAMIC FILLED FLUOROPOLYMERIC COMPOSITE MATERIAL

[75] Inventors: David J. Arthur, Norwood; Gwo S. Swei, Northboro, both of Mass.; Allen F. Horn, III, Danielson, Conn.

[73] Assignee: Rogers Corporation, Rogers, Conn.

[*] Notice: The portion of the term of this patent subsequent to Jun. 18, 2008 has been disclaimed.

[21] Appl. No.: 704,303

[22] Filed: May 22, 1991

Related U.S. Application Data

[63] Continuation-in-part of Ser. No. 367,241, Jun. 16, 1989, Pat. No. 5,061,548, which is a continuation-in-part of Ser. No. 15,191, Feb. 17, 1987, Pat. No. 4,849,284, and a continuation-in-part of Ser. No. 483,501, Feb. 21, 1990, Pat. No. 5,024,871.

[51] Int. Cl.⁵ .............................................. B32B 5/16
[52] U.S. Cl. ..................... 428/323; 428/325; 428/331; 428/421; 428/422; 428/402; 428/403; 428/405; 428/901; 174/259
[58] Field of Search ............... 428/195, 325, 331, 421, 428/422, 405, 461, 901; 174/68.5

[56] References Cited

PUBLICATIONS

English Translation of JA P. Appln. Kokai No: 557-134806 to Kureha Chemical Industries. (Exhibit 2).

*Primary Examiner*—Patrick J. Ryan
*Assistant Examiner*—Elizabeth Evans
*Attorney, Agent, or Firm*—Fishman, Dionne & Cantor

[57] ABSTRACT

A composite material is presented comprised of a ceramic filled fluoropolymer wherein the ceramic is coated with a titanate and/or zirconate and the ceramic has a volume % fraction of between about 45-50.

17 Claims, 1 Drawing Sheet

CERAMIC FILLED FLUOROPOLYMERIC COMPOSITE MATERIAL

BACKGROUND OF THE INVENTION

This invention relates to a fluoropolymeric composite material. More particularly, this invention relates to a fluoropolymeric composite material which is particularly well suited for use as a bonding ply in a multiplayer circuit board and in other applications requiring the ability to flow as well as good thermal, mechanical and electrical properties.

U.S. Pat. No. 4,849,284 which is assigned to the assignee hereof and incorporated herein by reference describes a ceramic filled fluoropolymer-based electrical substrate material sold by Rogers Corporation under the trademark RO-2800. This electrical substrate material preferably comprises polytetrafluoroethylene filled with silica along with a small amount of microfiberglass. In an important feature of this material, the ceramic filler (silica) is coated with a silane coating material which renders the surface of the ceramic hydrophobic and provides improved tensile strength, peel strength and dimensional stability. The composite material of U.S. Pat. No. 4,849,284 discloses a volume % filler fraction (on a void free basis) of at least 50 for use as a circuit substrate or a bonding ply.

The ceramic filled fluoropolymer-based electrical substrate material of U.S. Pat. No. 4,849,284 is well suited for forming rigid printed wiring board substrate materials and exhibits improved electrical performance over other printed wiring board materials. Also, the low coefficients of thermal expansion and compliant nature of this electrical substrate material results in improved surface mount reliability and plated through-hole reliability. As is known, individual sheets of this electrical substrate material may be stacked to form a multilayer circuit board. In fact, thin film formulations of the material disclosed in U.S. Pat. No. 4,849,284 (and sold by Rogers Corporation under the trademark RO-2810) may be used as a bonding ply to bond together a plurality of stacked substrate layers so as to form the multilayer circuit broad.

It will be appreciated that high volume fractions (greater than 55 volume %) of ceramic filler will significantly and adversely effect the rheology (e.g. flow) of the ceramic filled fluoropolymer composite. This is particularly important when the composite is used as a bonding film or in filling openings in previously rigid structures. While ceramic filler volume fractions of 50-55 % provide significantly improved rheological properties relative to higher filler fractions, there is a perceived need to provide even better flow properties to the fluoropolymeric composite without appreciably altering the excellent thermal, mechanical and electrical properties.

In U.S. Ser. No. 483,501 filed Feb. 21, 1990, now U.S. Pat. No. 5,024,871. (which is assigned to the assignee hereof and fully incorporated herein by reference), it had been discovered that the silane coating on the ceramic filler of the electrical substrate material disclosed in U.S. Pat. No. 4,849,284 may be replaced with zirconate coupling agents and/or titanate coupling agents and the resultant composite material will still retain the excellent thermal, mechanical and electrical properties as that described in U.S. Pat. No. 4,849,284.

SUMMARY OF THE INVENTION

It has now been discovered that the ceramic filler content of the material disclosed in U.S. Pat. No. 4,849,284 and U.S. Ser. No. 483,501 may be as low as 45 volume % on a void-free basis and still retain adequate thermal, mechanical and electrical properties to be used as a bonding ply in multilayer circuit materials and as a filling material for certain rigid structures. Accordingly, the present invention comprises a ceramic filled fluoropolymer containing 45-50 volume % titanate and/or zirconate coated ceramic.

The ceramic filled fluoropolymeric composite material of the present invention has improved rheology relative to the material of U.S. Pat. No. 4,849,284 and is useful in those applications requiring access holes and feature filling by resin flow without an excessive increase in the material's z-axis CTE.

The above-discussed and other features and advantages of the present invention will be appreciated and understood by those of ordinary skill in the art from the following detailed description and drawings.

BRIEF DESCRIPTION OF THE DRAWING

Referring now to the drawings.

DESCRIPTION OF THE PREFERRED EMBODIMENT

Figure 1A:
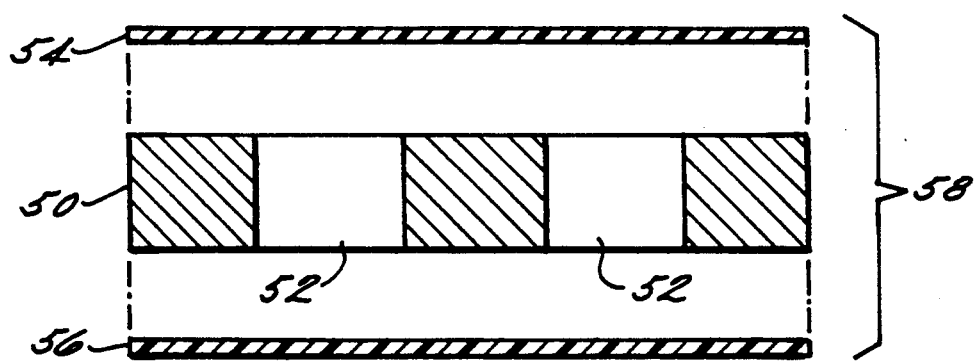
FIG. 1A and 1B are respective cross-sectional elevation views of a rigid structure having openings prior and subsequent to being filled with the composite material of the present invention.

The ceramic filled fluoropolymeric composite of the present invention is substantially similar to the composite described in U.S. Pat. No. 4,849,284 (which has been fully incorporated herein by reference) with the exception that the ceramic is present on a void-free basis in an amount of as low as 45 volume % and the ceramic filler is coated with a titanate and/or zirconate. Thus, in a preferred embodiment, the present invention comprises a composite of particulate ceramic filler present at a volume fraction of about 0.45 to 0.50 and fluoropolymer (e.g. PTFE) present at a volume fraction of 0.50 to 0.55 on a void-free basis. The preferred ceramic filler is fused amorphous silica, however other particulate siliceous fillers such as sand and clay may be used. In addition, reinforcement material such as fiberglass, solid glass beads and bulk glass panels in amounts of equal to or less than 2% (by weight) may be used. As mentioned, all other compositional features (with the exception of the titanate and/or zirconate coatings) and methods of manufacture are the same as that disclosed in U.S. Pat. No. 4,849,284. Accordingly, reference is to be made to U.S. Pat. No. 4,849,284 for those details.

Suitable zirconate coupling agents include, but are not limited to neopentyl(diallyloxy)tri(dioctyl) pyrophosphate zirconate and neopentyl(diallyoxy)tri(N-ethylenediamino) ethyl zirconate which is available from Kenrich Petrochemicals, Inc. under the tradename LZ-44.

Suitable titanate coupling agents include neopantyl(-diallyl)oxy, trineodecanonyl titanate, neopentyl(diallyl-)oxy, tri(dodecyl)benzene-sulfonyl titanate, neopentyl(-diallyl)oxy, tri(dioctyl)phosphato titanate, neopentyl(- diallyl)oxy, tri(dioctyl)pyro-phosphato titanate, neopentyl(diallyl)oxy, tri(N-ethylenediamino) ethyl titanate, neopentyl(diallyl)oxy, tri(m-amino)phenyl titanate, and neopentyl(diallyl)oxy, trihydroxy caproyl titanate; all of which are available from Kenrich Petrochemicals, Inc. under the tradename LICA.

Preferred zirconate and titanate coating for effecting the important features associated with the electrical substrate material of this invention is 1% by weight of the filler (ceramic) material.

By this reduction in filler content, the rheology of the material of the present invention is improved to the point that it will "flow" and fill comparatively large openings in thick metal foils or inner layers of circuitry that cannot be filled by some of the highly filled (greater than 55 volume % fraction) materials disclosed in U.S. Pat. No. 4,849,284. The only compositional difference between the present invention and the materials described in U.S. Pat. No. 4,849,284 application is the reduced level of particulate ceramic filler, the absence of glass microfiber and the titanate and/or zirconate coatings in the present invention. The materials comprising the present invention can be produced either by "wet blending" PTFE polymer in dispersion with the ceramic filler and coagulation or by dry blending of PTFE fine powders with the ceramic filler.

An important feature of the present invention is the fact that the rheology is improved without excessively increasing the Z-axis coefficient of thermal expansion (CTE) of the material. The Z-axis CTE of the 45-50 volume % filler formulation has been measured to be about 70 ppm/° C. over the temperature range of $-55°$ to $+125°$ C.; no worse than that of the widely used FR4 epoxy-glass composite laminate. Multilayer circuit boards made from RO 2800 laminate bonded together with bonding ply layers of the present invention will exhibit an overall CTE considerably lower than that of an FRr board. The decreased CTE is important in increasing the reliability of plated through holes to withstand thermal cycling.

Figure 1B:
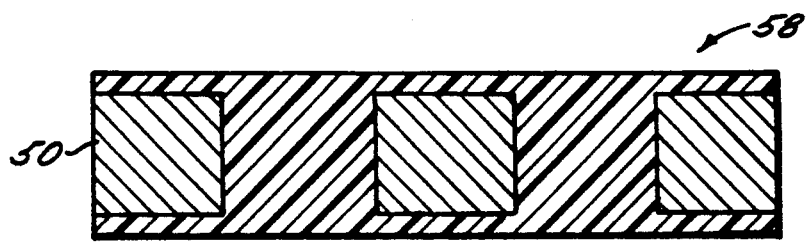

The present invention extends the number of applications in which ceramic filled PTFE composite materials can be used for constructing useful printed wiring boards. The present invention has the particular utility in filling openings in already rigid structures, such as etched CIC voltage or ground Planes and restraining cores, or circuitry bonded to such structures. For example, in FIG. 1A, a rigid ground plane structure is depicted in cross-section at 50 several having openings 52. Sheets 54, 56 of the present invention (e.g., 0.45 to 0.50 volume fraction ceramic) are then positioned on either side of ground plane 50. In FIG. 1B, the stack-up 58 of FIG. 1A is laminated under heat and pressure. The composition of this invention will permit good flow so as to completely fill the openings while also providing excellent thermal, mechanical and electrical properties.

Figure 2:
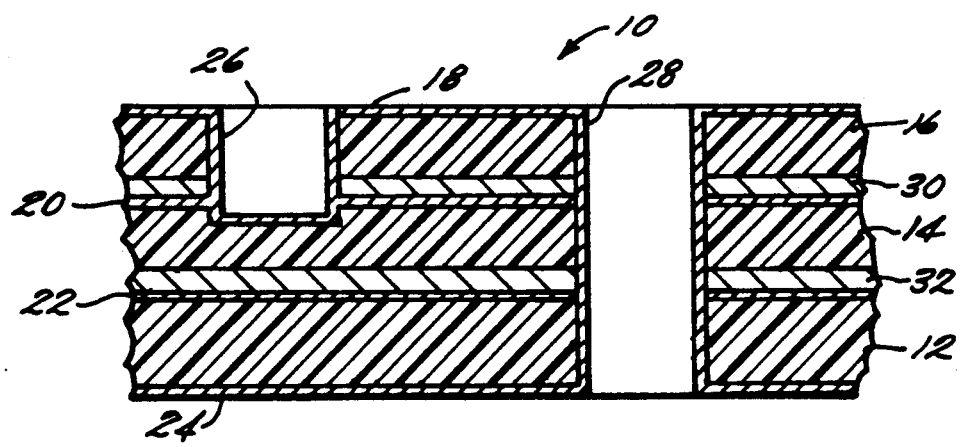
FIG. 2 is a cross-sectional elevation view of a multilayer circuit board employing the thermoplastic composite material in accordance with the present invention as a thin film bonding ply.

In addition and referring to FIG. 2, the composite of this invention may be processed into a sheet in its undensified, unsintered form and used for bonding multilayer printed wiring boards or constructing printed wiring boards by foil lamination. Turning now to FIG. 2, such a multilayer circuit board is shown generally at 10. Multilayer board 10 comprises a plurality of layers of substrate material 12, 14 and 16, all of which are comprised of an electrical substrate material, preferably the ceramic filled fluoropolymeric material of U.S. Ser. No. 367,241, U.S. Ser. No. 483,501 or U.S. Pat. No. 4,849,284 sold under the RO-2800 trademark. Each substrate layer 12, 14 and 16 has a conductive pattern 18, 20, 22 and 24 respectively thereon. Note that a substrate layer having a circuit pattern thereon defines a circuit substrate. Plated through holes 26 and 28 interconnect selected circuit patterns in a known manner.

In accordance with the present invention, separate sheets 30 and 32 of substrate material having a composition in accordance with the present invention are used as an adhesive or bond ply to laminate individual circuit substrates together. In a preferred method of forming such a laminate, a stack-up of circuit substrates altered with one or more layers of the bond ply is made. This stack-up is then fusion bonded whereby the entire multilayer assembly is melted and fused into a homogeneous construction with consistent electrical and mechanical properties throughout. Significantly, note that the adhesive bond ply layers 30 and 32 may be used to laminate circuit substrates comprised of materials other than the silane coated ceramic filled fluoropolymer of U.S. Pat. No. 4,849,284. Although, in a preferred embodiment, a multilayer circuit board includes circuit substrates which are all comprised of the electrical substrate material of U.S. Pat. No. 4,849,284.

The present invention will be more fully understood from the following non-limiting EXAMPLE of silane coated composites. As disclosed in aforementioned U.S. Ser. No. 483,501, zirconate and/or titanate coatings will provide results approaching, if not equal to, those associated with silane. Thus, the titanate and/or zirconate coated ceramic filled fluoropolymer of this invention will exhibit the same or similar properties as silane coated composites.

Five, seven and nine mil sheets of PTFE/ceramic composites with 45 to 65 volume % (on a void-free basis) ceramic were prepared. To evaluate the rheology of these compounds, the sheets were laminated between two 0.031" copper plates with identical patterns of access holes of 0.030" to 0.125" diameter under 1700 psi laminate pressure. The laminated copper plates were then cross-sectioned and the filled holes were was evaluated by visual microscopy. The composites containing greater than 60 volume % ceramic (on void-free basis) did not flow sufficiently to fill any of the access holes. The composite containing 55 volume % filled the smaller diameter holes, but not those larger than 0.050" in diameter. The 45 and 50 volume % ceramic composites adequately filled the access openings whereas the ceramic volume fraction above that amount did not adequately fill access openings.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A nonconductive electrical substrate material comprising:
   fluoropolymeric material;
   ceramic filler material, said filler material being in an amount of at least about 45 to less than 50 volume percent of the total substrate material; and
   said ceramic filler being coated by a titanate or zirconate coating.

2. The material of claim 1 including:
   at least one layer of conductive material being disposed on at least a portion of said electrical substrate material.

3. The material of claim 1 wherein said fluoropolymeric material is selected from the group comprising: polytetrafluoroethylene, hexa fluoropropene, tetrafluoroethylene or perfluoro alkyl vinyl ether.

4. The material of claim 1 wherein said ceramic filler comprises silica.

5. The material of claim 1 wherein said zirconate coating is selected from the group comprising: neopentyl(diallyloxy)tri(dioctyl) pyro-phosphate zirconate and neopentyl(diallyoxy)tri(N-ethylenediamino) ethyl zirconate.

6. The material of claim 1 wherein said titanate coating is selected from the group comprising: neopantyl(diallyl)oxy, trineodecanonyl titanate, neopentyl(diallyl)oxy, tri(dodecyl)benzene-sulfonyl titanate, neopentyl(diallyl)oxy, tri(dioctyl)phosphato titanate, neopentyl(diallyl)oxy, tri(dioctyl)-pyro-phosphato titanate, neopentyl(diallyl)oxy, tri(N-ethylenediamino)ethyl titanate, neopentyl(diallyl)oxy, tri(m-amino)phenyl titanate, and neopentyl(diallyl)oxy, trihydroxy caproyl titanate.

7. In a multilayer circuit including at least a first circuit layer and a second circuit layer, the improvement comprising:
a noncondutive adhesive layer sandwiched between the first and second circuit layers, said adhesive layer comprising:
fluoropolymeric material;
ceramic filler material, said filler material being in an amount of at least about 45 to less than 50 volume percent of the total adhesive layer; and
said ceramic filler being coated with a titanate or zirconate coating.

8. The multilayer circuit of claim 7 including:
at least one plated through hole.

9. The multilayer circuit of claim 7 wherein said fluoropolymeric material is selected from the group comprising:
polytetrafluoroethylene, hexa fluoropropene, tetrafluoroethylene or perfluoro alkyl vinyl ether.

10. The multilayer circuit of claim 7 wherein said ceramic filler comprises silica.

11. The multilayer circuit of claim 7 wherein said zirconate coating is selected from the group comprising:
neopentyl(diallyloxy)tri(dioctyl) pyro-phosphate zirconate and neopentyl(diallyoxy)tri(N-ethylenediamino)ethyl zirconate.

12. The multilayer circuit of claim 7 wherein said titanate coating is selected from the group comprising: neopantyl(diallyl)oxy, trineodecanonyl titanate, neopentyl(diallyl)oxy, tri(dodecyl)benzene-sulfonyl titanate, neopentyl(diallyl)oxy, tri(dioctyl)phosphato titanate, neopentyl(diallyl)oxy, tri(dioctyl)-pyro-phosphato titanate, neopentyl(diallyl)oxy, tri(N-ethylenediamino) ethyl titanate, neopentyl(diallyl)oxy, tri(m-amino)phenyl titanate, and neopentyl(diallyl)oxy, trihydroxy caproyl titanate.

13. An article comprising:
a rigid substrate, said rigid substrate having at least one opening at least partially through said substrate;
a nonconductive composite material in said at least one opening, said composite material including;
fluoropolymeric material;
ceramic filler material, said filler material being in an amount of at least about 45 to 50 volume percent of the total composite material; and
said ceramic filler being coated by a titanate or zirconate coating.

14. The article of claim 13 wherein said fluoropolymeric material is selected from the group comprising:
polytetrafluoroethylene, hexa fluoropropene, tetrafluoroethylene or perfluoro alkyl vinyl ether.

15. The article of claim 13 wherein said ceramic filler comprises silica.

16. The article of claim 13 wherein said zirconate coating is selected from the group comprising:
neopentyl(diallyloxy)tri(dioctyl) pyro-phosphate zirconate and neopentyl(diallyoxy)tri(N-ethylenediamino) ethyl zirconate.

17. The article of claim 13 wherein said titanate coating is selected from the group comprising:
neopantyl(diallyl)oxy, trineodecanonyl titanate, neopentyl(diallyl)oxy, tri(dodecyl)benzene-sulfonyl titanate, neopentyl(diallyl)oxy, tri(dioctyl)phosphato titanate, neopentyl(diallyl)oxy, tri(dioctyl)-pyro-phosphato titanate, neopentyl(diallyl)oxy, tri(N-ethylenediamino) ethyl titanate, neopentyl(diallyl)oxy, tri(m-amino)phenyl titanate, and neopentyl(diallyl)oxy, trihydroxy caproyl titanate.

* * * * *